(12) United States Patent
Wang et al.

(10) Patent No.: US 12,388,010 B2
(45) Date of Patent: Aug. 12, 2025

(54) VIA ANCHOR PROFILE CONTROL

(71) Applicant: Taiwan Semiconductor Manufacturing Company, Ltd., Hsinchu (TW)

(72) Inventors: Chi-Shin Wang, Hsinchu (TW); Yu-Hsiang Wang, Miaoli (TW); Wei-Ting Chang, Taichung (TW); Fan-Yi Hsu, Miaoli (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 434 days.

(21) Appl. No.: 17/901,442

(22) Filed: Sep. 1, 2022

(65) Prior Publication Data

US 2024/0079315 A1 Mar. 7, 2024

(51) Int. Cl.
| | |
|---|---|
| *H01L 23/522* | (2006.01) |
| *H01L 21/3213* | (2006.01) |
| *H01L 21/768* | (2006.01) |
| *H01L 23/532* | (2006.01) |
| *H10D 64/01* | (2025.01) |

(52) U.S. Cl.
CPC .... *H01L 23/5226* (2013.01); *H01L 21/32134* (2013.01); *H01L 21/76805* (2013.01); *H01L 21/76877* (2013.01); *H01L 23/53257* (2013.01); *H10D 64/01* (2025.01)

(58) Field of Classification Search
CPC ........... H01L 23/5226; H01L 23/53257; H01L 21/32134; H01L 21/76805; H01L 21/76877; H10D 64/01
USPC ........................................................ 257/758
See application file for complete search history.

(56) References Cited

U.S. PATENT DOCUMENTS

| | | | |
|---|---|---|---|
| 7,928,570 B2 * | 4/2011 | Ponoth | H01L 21/76805 |
| | | | 257/680 |
| 11,233,005 B1 | 1/2022 | Chen et al. | |
| 2022/0230925 A1 | 7/2022 | More et al. | |
| 2022/0343135 A1 | 10/2022 | Naderiparizi et al. | |

FOREIGN PATENT DOCUMENTS

| | | |
|---|---|---|
| TW | 202129838 A | 8/2021 |
| TW | 202145321 A | 12/2021 |
| TW | 202203375 A | 1/2022 |

* cited by examiner

*Primary Examiner* — Tu-Tu V Ho
(74) *Attorney, Agent, or Firm* — Sterne, Kessler, Goldstein & Fox P.L.L.C.

(57) ABSTRACT

Improved control of via anchor profiles in metals at a contact layer can be achieved by slowing down an anchor etching process and by introducing a passivation operation. By first passivating a metallic surface, etchants can be prevented from dispersing along grain boundaries, thereby distorting the shape of the via anchor. An iterative scheme that involves multiple cycles of alternating passivation and etching operations can control the formation of optimal via anchor profiles. When a desirable anchor shape is achieved, the anchor maintains structural integrity of the vias, thereby improving reliability of the interconnect structure.

20 Claims, 10 Drawing Sheets

VIA ANCHOR PROFILE CONTROL

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, fin field effect transistors (FinFETs), gate all-around field effect transistors (GAAFETs), and interconnects among these devices. Such scaling down has increased the complexity of semiconductor manufacturing processes.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
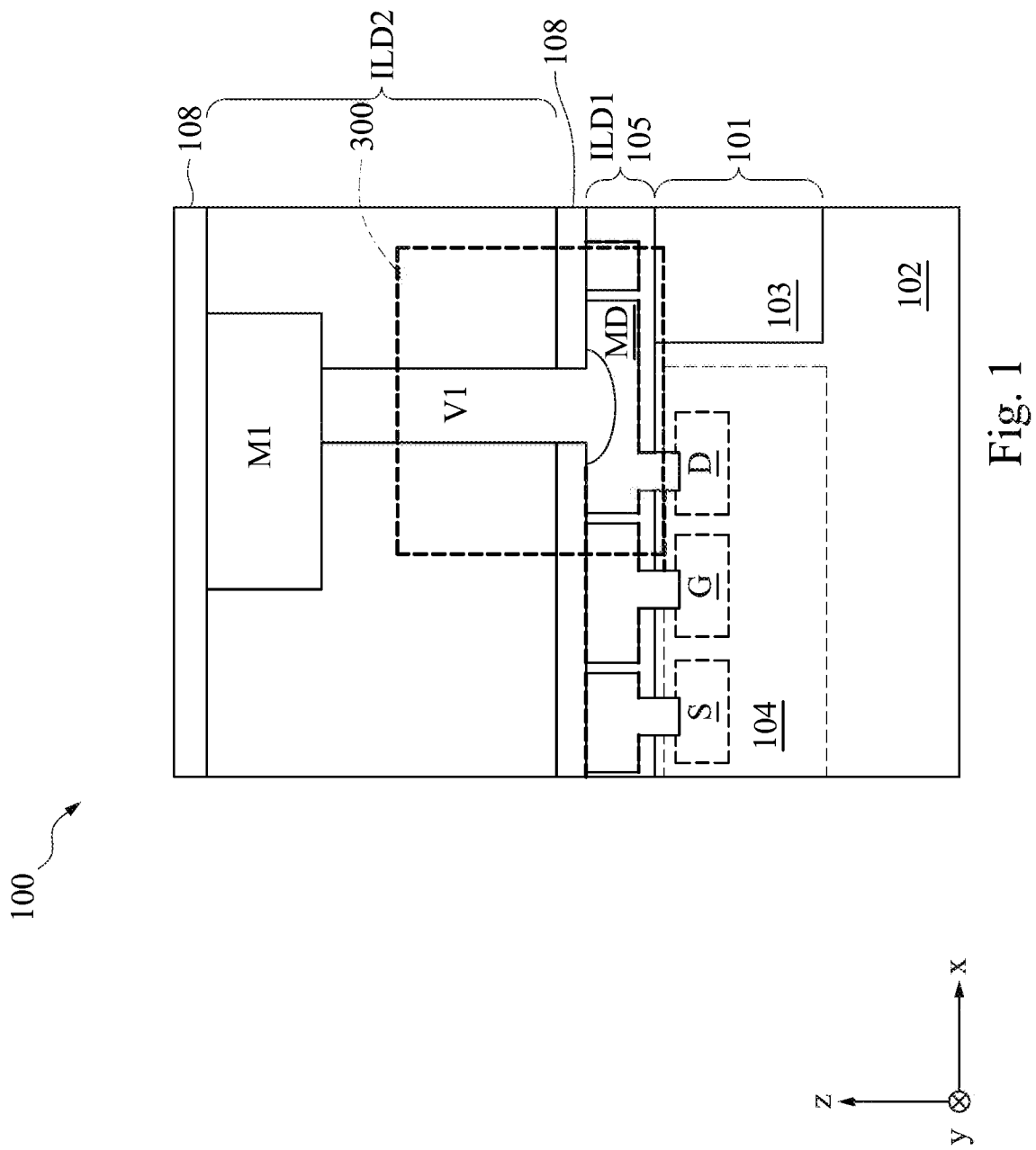
FIG. 1 is a cross-sectional view of an interconnect structure that provides electrical connections to a transistor in an integrated circuit, in accordance with some embodiments of the present disclosure.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments of the present disclosure, the terms "about" and "substantially" can indicate a value of a given quantity that varies within 20% of the value (e.g., ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

The term "vertical," as used herein, means perpendicular to the surface of a substrate.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

Interconnect structures for integrated circuits include layers of metal lines coupled vertically to one another by a network of vias. Via anchors are used to provide mechanical stability for the interconnect structures by holding each via securely in place at the lower metal line. However, when vias are coupled to a contact layer under a metal line in a first metallization layer (also referred to herein as "metal line M1"), problems may arise due to different metal materials that are used for contacts to enhance conductivity. For example, the use of metal materials for contacts, such as cobalt, can degrade via anchor formation due to the presence of grain boundaries within the metal material. Such grain boundaries may not be present at higher metal layers (e.g., above the first metallization layer) that are made of other materials, such as aluminum and copper alloy materials. Another reason for malformed via anchors is because of localized pattern loading effects. Malformation of via anchors within the contact layer can compromise the via anchor's function so that, in the presence of vertical strain, vias that are not properly anchored may pull away from the contact layer, resulting in a structural failure.

Improved control of via anchor profiles in metals that exhibit grain boundaries can be achieved by slowing down the anchor etching process and by introducing a passivation operation. By first passivating the metallic surface, etchants can be prevented from dispersing along grain boundaries, thereby distorting the shape of the via anchor. An iterative scheme that involves a multi-cycle process of alternating passivation and etching operations can control the formation of optimal via anchor profiles. When a desirable via anchor shape is achieved having sufficient lateral undercut, the via anchor maintains structural integrity of the vias thereby improving reliability of the interconnect structure.

FIG. 1 shows a cross-sectional view of an integrated circuit 100 incorporating a first metal line M1 and a via V1, according to some embodiments. Integrated circuit 100 includes a transistor layer 101, a substrate 102, a contact layer 105, and two inter-layer dielectric (ILD) layers ILD1 and ILD2. Metal interconnect structures including metal line M1 and via V1 are fabricated above transistor layer 101 and contact terminals of transistor 104—e.g., in source (S), drain (D), and gate (G) regions of transistor 104—in which one transistor is shown in FIG. 1. Based on the description herein, integrated circuit 100 can include more than one transistor.

For example, metal line M1 and via VI shown in FIG. 1 are coupled to a drain terminal of transistor 104 via a drain contact in contact layer 105, while other interconnect structures (not shown in integrated circuit 100) can be coupled to gate and source terminals of transistor 104, as well as to other transistors of integrated circuit 100 (not shown in FIG. 1.) In some embodiments, metal line M1 and via VI are made of copper and are formed using a damascene process, a dual damascene process, or any other suitable patterning process. In some embodiments, metal line M1 is made of an aluminum alloy, e.g., AlCu, by depositing, patterning, and etching the aluminum alloy. Liners may be formed on interior surfaces of metal line M1, as well as on interior surfaces of via VI. Integrated circuit 100 can include additional metal lines and vias above metal line M1.

ILD1 and ILD2 provide electrical insulation around metal line M1 and via V1. Etch stop layers 108 can be used to delineate adjacent ILD layers—e.g., ILD1 and ILD 2—and to protect underlying films from damage due to deposition of dielectric materials, such as SiN, silicon carbon nitride (SiCN), silicon carbide (SiC), aluminum oxide (AlO or $Al_2O_3$), and aluminum nitride (AlN). In some embodiments, etch stop layers 108 form compressive stress and improve adhesion of adjacent layers.

Figure 2:
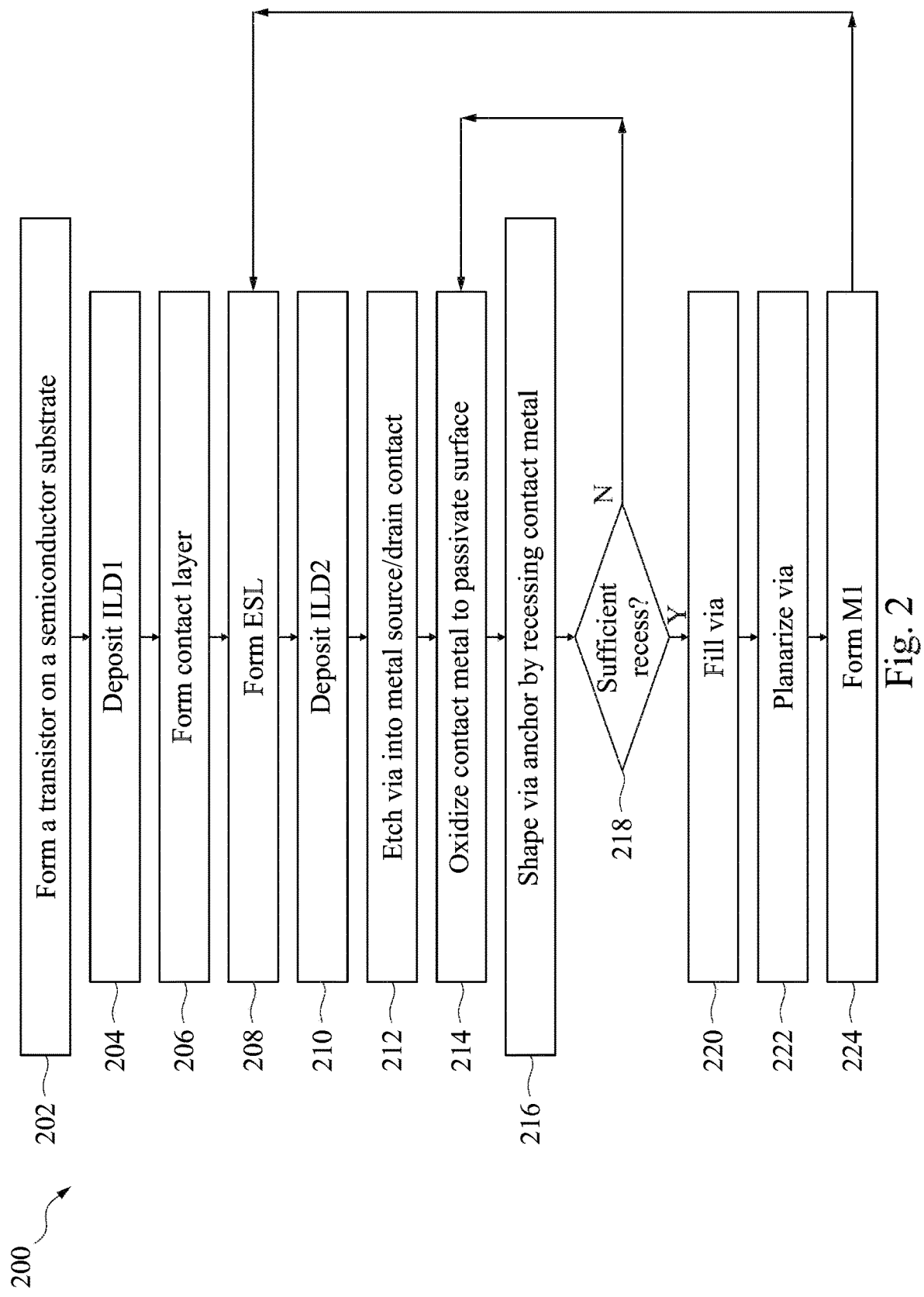
FIG. 2 is a flow diagram of a method for fabricating the interconnect structure shown in FIG. 1, in accordance with some embodiments of the present disclosure.

FIG. 2 illustrates a method 200 for fabricating integrated circuit 100 that includes interconnect structures, such as metal line M1 and via V1, according to some embodiments. For illustrative purposes, operations illustrated in FIG. 2 will be described with reference to processes for fabricating interconnect structures as illustrated in FIGS. 3-7, which are cross-sectional views of via V1 and associated via anchors at various stages of their fabrication, according to some embodiments. Operations of method 200 can be performed in a different order, or not performed, depending on specific applications. It is noted that method 200 may not produce a complete integrated circuit 100 or a complete interconnect. Accordingly, it is understood that additional processes can be provided before, during, or after method 200, and that some of these additional processes may be briefly described herein.

Referring to FIG. 2 in operation 202, a transistor 104 is formed on substrate 102, as shown in FIG. 1, according to some embodiments. As used herein, the term "substrate" describes a material onto which subsequent material layers are added. Substrate 102 itself may be patterned. Materials added on substrate 102 may be patterned or may remain unpatterned. Substrate 102 can be a bulk semiconductor wafer or the top semiconductor layer of a semiconductor-on-insulator (SOI) wafer (not shown), such as silicon-on-insulator. In some embodiments, substrate 102 can include a crystalline semiconductor layer with its top surface parallel to (100), (110), (111), or c-(0001) crystal plane. Alternatively, substrate 102 may be made from an electrically non-conductive material, such as a glass, sapphire, or plastic. Substrate 102 can be made of a semiconductor material, such as silicon (Si). In some embodiments, substrate 102 can include (i) an elementary semiconductor, such as germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium carbide (SiGeC), silicon germanium (SiGe), gallium arsenic phosphide (GaAsP), gallium indium phosphide (InGaP), gallium indium arsenide (InGaAs), gallium indium arsenic phosphide (InGaAsP), aluminum indium arsenide (InAlAs), and/or aluminum gallium arsenide (AlGaAs); or (iv) a combination thereof. Further, substrate 102 can be doped with p-type dopants (e.g., boron (B), indium (In), aluminum (Al), or gallium (Ga)) or n-type dopants, such as phosphorus (P) or arsenic (As)). In some embodiments, different portions of substrate 102 can have opposite type dopants.

Transistor layer 101 includes a shallow trench isolation (STI) regions 103 and transistor 104, as illustrated schematically in FIG. 1 for an exemplary metal oxide semiconductor field effect transistor (MOSFET). Transistor 104 is electrically isolated from other transistors or electrical components by STI region 103. In some embodiments, transistor 104 can be a bipolar junction transistor (BJT), a planar metal oxide semiconductor field effect transistors (MOSFET), a three-dimensional MOSFET (e.g., FinFET, nanowire FET, nanosheet FET, or a gate-all-around FET (GAAFET)), or any other suitable transistor device.

STI region 103 can be formed adjacent to, or between, transistor 104 and other electrical components (not shown in FIG. 1). STI region 103 can be deposited and then etched back to a desired height. Insulating material in STI regions 103 can include, for example, silicon oxide ($SiO_2$), silicon nitride (SiN), silicon oxynitride (SiON), fluoride-doped silicate glass (FSG), a low-k dielectric material, or any other suitable insulating material. In some embodiments, the term "low-k" refers to a low dielectric constant. In the field of semiconductor device structures and manufacturing processes, low-k refers to a dielectric constant that is less than the dielectric constant of $SiO_2$ (e.g., less than 3.9).

In some embodiments, STI region 103 can include a multi-layered structure. In some embodiments, the process of depositing the insulating material for STI region 103 can include any deposition method suitable for flowable dielectric materials (e.g., flowable silicon oxide). For example, flowable silicon oxide can be deposited for STI region 103 using a flowable chemical vapor deposition (FCVD) process. The FCVD process can be followed by a wet anneal process. In some embodiments, the process of depositing the insulating material can include depositing a low-k dielectric material to form a liner. In some embodiments, a liner made of another suitable insulating material can be placed between STI region 103 and adjacent transistor 104. In some embodiments, STI region 103 may be annealed and polished to be co-planar with a top surface of transistor 104.

Referring to FIG. 2 in operation 204, ILD1 can be formed above contact layer 105 as shown in FIG. 1, in accordance with some embodiments. ILD1 can be about 1050 A to about 1350 A of an insulating material, such as silicon dioxide (SiO2), fluorosilicate glass (FSG), hard black diamond (HBD), a low-k silicon oxycarbide ("low-k" SiOC/LK5/LK6), an extreme low-k dielectric material, (e.g., silicon oxycarbide nitride ("ELK" SiOCN/LK9S)), and combinations thereof. ILD1 can be made of a single insulating material or a layered stack that includes multiple insulating materials. Such materials have dielectric constants, K, ranging from about 3.9 for SiO2 to about 2.5 for ELK. Low-k and extreme low-k dielectrics may vary in their respective carbon concentrations such that a higher concentration of carbon in the SiOC material causes the dielectric constant to be lower.

Referring to FIG. 2 in operation 206, contact layer 105 is formed above transistor layer 101 as shown in FIG. 1, in accordance with some embodiments. Contact layer 105 provides electrical connections between transistor 104 and via VI. The process of forming contact layer 105 can include forming metal silicide layers and/or conductive regions (contacts) within contact openings in an ILD material. The contacts provide electrical connections to the terminals, e.g., source, gate, and drain terminals of transistor 104. In some embodiments, the metal used to form metal silicide layers of contact layer 105 can include one or more of tungsten (W), cobalt (Co), titanium (Ti), and nickel (Ni). In some embodiments, the metal is deposited by atomic layer deposition (ALD), physical vapor deposition (PVD), plasma enhanced chemical vapor deposition (PECVD), or chemical vapor deposition (CVD) to form diffusion barrier layers (not shown) along surfaces of contact layer 105. The deposition of diffusion barrier layers can be followed by a high temperature rapid thermal annealing (RTP) process to form metal silicide layers.

The process of forming conductive regions of contact layer 105 can include deposition of a conductive material followed by a polishing process to co-planarize top surfaces of the conductive regions with top surfaces of insulating material surrounding contact layer 105. The conductive materials can be one or more of W, Co, Ti, aluminum (Al), copper (Cu), gold (Au), silver (Ag), a metal alloy, a stack of various metals or metal alloys that may include a layer of titanium nitride (TiN), or any other suitable material. The conductive materials can be deposited by, for example, CVD, PVD, PECVD, or ALD. The polishing process for co-planarizing the conductive region with the top surface of contact layer 105 can be a chemical-mechanical planarization (CMP) process. In some embodiments, the CMP process can use a silicon or an aluminum abrasive slurry with abrasive concentrations ranging from about 0.1% to about 3%. In some embodiments, the abrasive slurry may have a pH level less than about 7 for W metal, or a pH level greater than about 7 for Co or Cu metals in the conductive regions.

Referring to FIG. 2, in operation 208, an etch stop layer 108 can be formed on contact layer 105 as shown in FIG. 1, according to some embodiments. In some embodiments, etch stop layer 108 includes one or more of SiCN, SiC, SiN, AlN, AlO, $Al_2O_3$, $SiO_2$, or other suitable materials that can be more etch-resistant than low-k ILD materials, such as SiOC. In some embodiments, etch stop layer 108 can be formed with a compressive strain so as to improve adhesion to metal line M1.

Referring to FIG. 2, in operation 210, ILD2 can be formed above etch stop layer 108 as shown in FIG. 1, in accordance with some embodiments. ILD2 can be formed in a similar manner as ILD1 as described above with respect to operation 204. For example, ILD2 can be formed as another low-k or extreme low-k dielectric material similar to ILD1, as described above. In some embodiments, ILD2 can be about 100 Å thicker than ILD1 and can have a thickness in a range from about 1150 Å to about 1450 Å.

Figure 3:
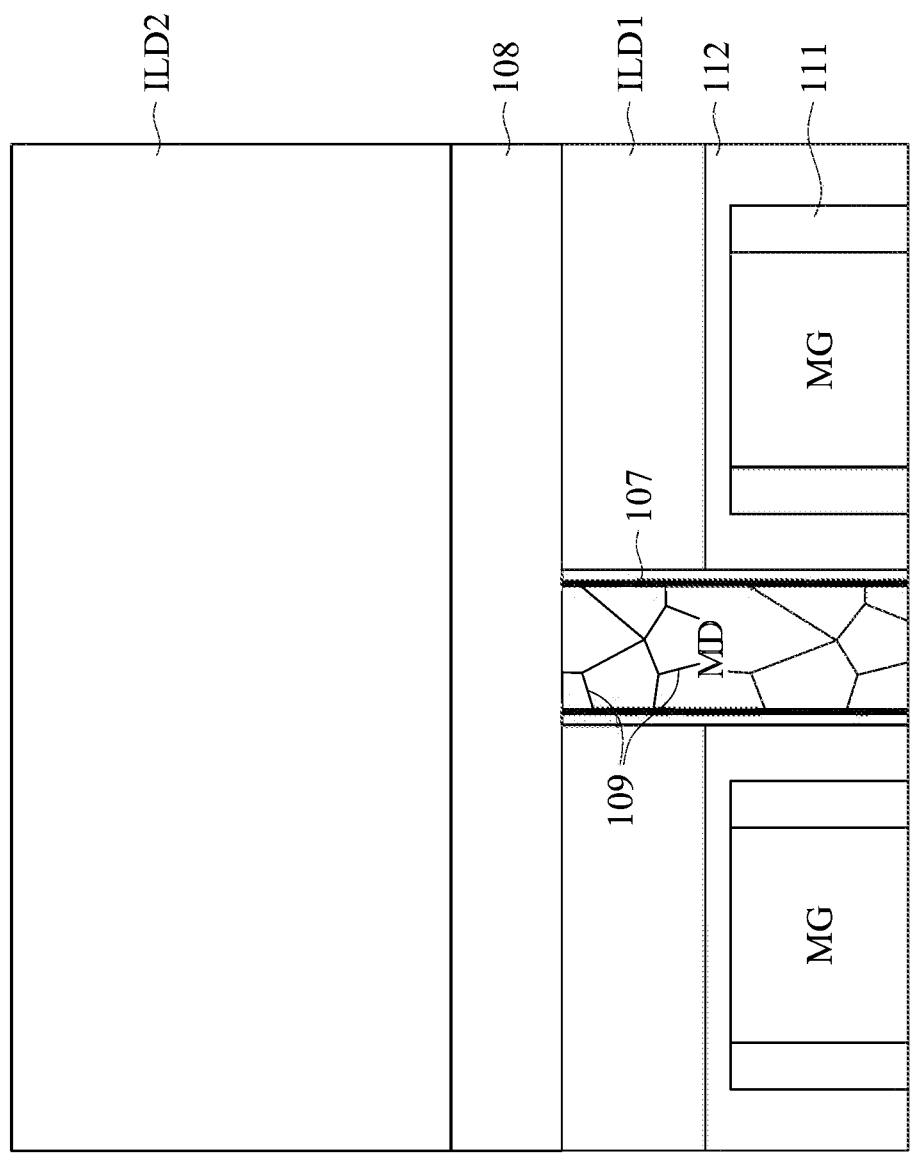
FIGS. 3-5 and 8-10 are cross-sectional views of a magnified portion of the interconnect structure shown in FIG. 1 at various stages of its fabrication process, in accordance with some embodiments of the present disclosure.

FIG. 3 is a magnified view of a representative portion of FIG. 1 inside a dashed line box 300, up to operation 210 in the fabrication of integrated circuit 100. FIG. 3 shows contact layer 105, including metal gate contacts MG and a metal source/drain contact MD (also referred to herein as "source/drain contact MD"), ILD1, etch stop layer 108, and ILD2. In some embodiments, source/drain contact MD can include a liner 107. Source/drain contact MD can be made of a material, e.g., cobalt, that exhibits grain boundaries 109 between adjacent regions of the metal having different crystal orientations. Other materials can be used for source/drain contact MD. In some embodiments, metal gate contacts MG can have a thickness in a range of about 16 nm to about 20 nm. In some embodiments, metal gate contacts MG can be surrounded by one or more spacers, e.g., a sidewall spacer 111 and/or spacer 112, e.g., a silicon nitride (SiN) spacer, such that the thickness of ILD1 and spacer 112 together is between about 15 and about 19 nm. In some embodiments, etch stop layer 108 is a SiN layer having a thickness in a range of about 9 nm to about 11 nm, and ILD2 has a thickness in a range of about 45 nm to about 55 nm.

Figure 4:

Referring to FIG. 2 in operation 212, a via opening 400 can be formed as shown in FIG. 4 in accordance with some embodiments. Via opening 400 can be formed directly above a metal source/drain contact MD of contact layer 105 as shown in FIG. 1. Via opening 400 extends through ILD2 and etch stop layer 108 to expose a top surface of source/drain contact MD. In some embodiments, via opening 400 can be tapered so that via opening 400 is wider at the top (e.g., at the top surface of ILD2) than at the bottom where via opening 400 exposes the top surface of source/drain contact MD. Via opening 400 can be formed by etching through both ILD2 and etch stop layer 108 using, for example, a plasma etch chemistry (e.g., a fluorine-based chemistry).

Figure 5:
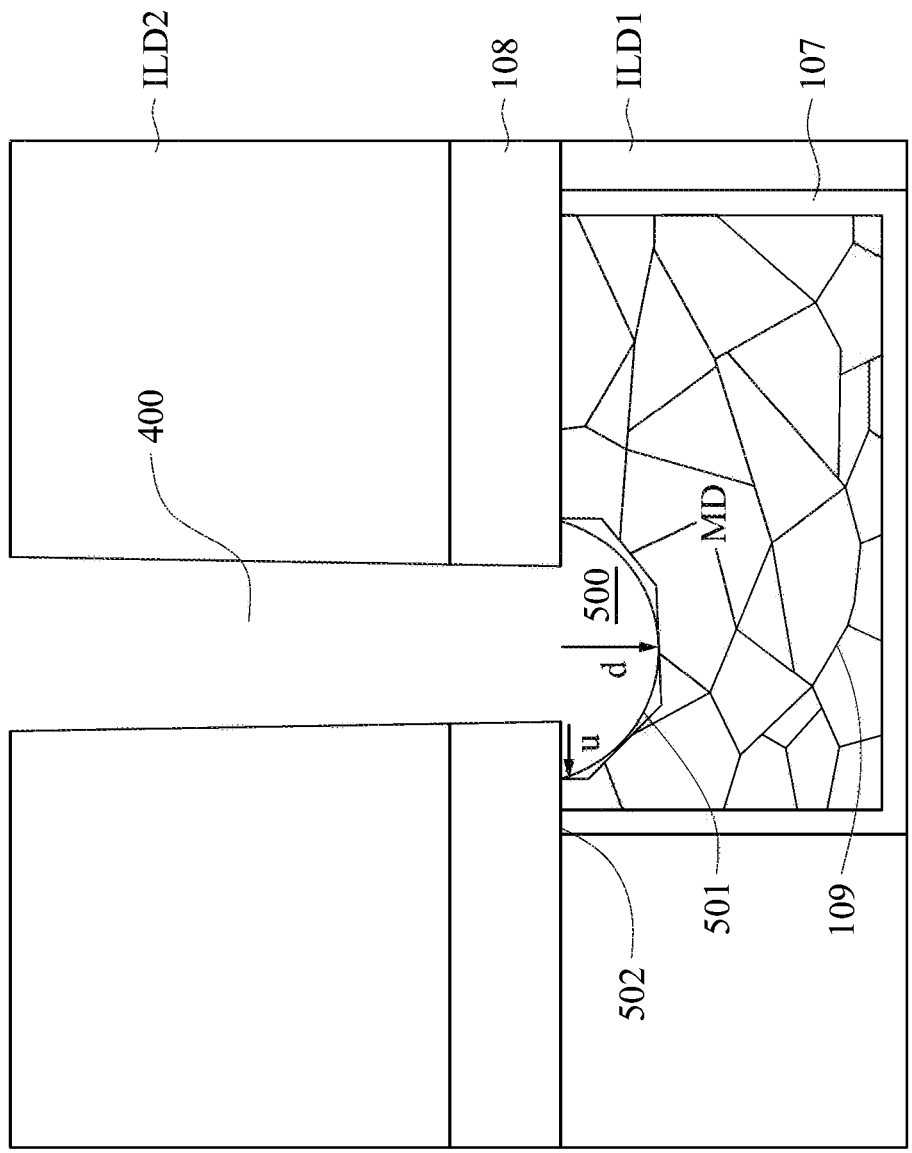

Referring to FIG. 2 in operations 214 and 216, a via anchor opening 500 can be formed as shown in FIG. 5, in accordance with some embodiments. When via opening 400 and via anchor opening 500 are later filled with metal, e.g., tungsten, the shape of via anchor opening 500 provides mechanical stability to ensure that the metal filling the via stays firmly in place. In some embodiments, via anchor opening 500 has a rounded profile 501, resembling a semicircle or a half oval, characterized by a vertical dimension, depth d, below a bottom surface 502 of etch stop layer 108, and a lateral dimension, undercut u. Undercut u indicates how far via anchor opening 500 extends laterally beyond sidewalls of via opening 400, along bottom surface 502.

In some embodiments, formation of via anchor opening 500 having a well-controlled etch profile can be accomplished by alternating passivation and etching operations. First, via opening 400 and via anchor opening 500 can be exposed to a first wet chemical reaction that passivates the surface of via anchor opening 500. For example, passivation of the cobalt surface (or other suitable metal surface) is needed to remove residual fluorine (or other residues) from the via etch process that can be present on the cobalt metallic surface, and may be bonded to cobalt in the form of a cobalt fluoride compound (CoFx.) It is important to remove residual fluorine from the cobalt surface because fluorine will tend to accelerate the etch rate of cobalt along grain boundaries 109. The passivation operation can be, for example, an oxidation reaction. To initiate the oxidation reaction, via anchor opening 500 can be exposed to an oxidant having a pH in the range of about 9 to about 12. In some embodiments, the oxidant can be a mixture of ammonia-containing and oxygen-containing compounds. This mixture can be water ($H_2O$), ammonium hydroxide ($NH_4OH$), and hydrogen peroxide ($H_2O_2$)—in which all can be referred to as SCI—added to ammonia ($NH_3$). The amount of passivation that occurs during the oxidation reaction can be tuned by varying the concentration of $NH_4QH$ in the SC1 and a duration of the chemical reaction. The pH of the oxidant can be tuned by adjusting relative concentrations of peroxide and ammonia.

Following the passivation operation 214, via opening 400 and via anchor opening 500 can be exposed to a second wet chemical reaction that etches the metallic surface of via anchor opening 500 isotropically (e.g., with about the same etch rate in all directions) to achieve a desired rounded profile 501. In some embodiments, for a source/drain contact MD made of cobalt, the etchant can be hot de-ionized water, or "hot DI." The etch rate of cobalt in hot DI water is temperature dependent. In some embodiments, the temperature of the hot DI water is in a range of about 25 degrees C. to about 70 degrees C. Because the metal surface has been passivated, the etchant is inhibited from seeping into and following grain boundaries 109. Instead, the etchant remains contained within via anchor opening 500, resulting in improved consistency and control in the etch process without excessive cobalt loss (e.g., reduced cobalt loss at the bottom of via anchor opening 500).

By repeating the passivation and etching sequence—the sequence of operations 214 and 216—multiple times, the desired shape of via anchor opening 500 (and the subsequent via anchor) can be achieved. With a sufficient lateral undercut u, the anchor will stay in place and prevent via defects that may otherwise occur when via plugs pull out of metal source/drain contacts MD. For optimal anchor profiles, a ratio of lateral undercut to vertical recess depth, u/d, exceeds about 0.75 by varying the etch temperature, according to some embodiments. A higher temperature causes the ratio u/d to increase. A desirable recess depth for the current technology node is in the range of about 13 nm to about 15 nm. A desirable undercut is in the range of about 9.5 nm to about 11.5 nm. In some embodiments, the target ratio of u/d of at least 0.75 has been determined after consideration of differently shaped via footprints. Such footprints can include slot vias that have a rectangular footprint, square vias that have a square footprint about 2-3 times smaller than that of the slot vias, round vias, and half vias that coincide with the end of a metal line. A range for the ratio u/d can be between about 0.7 and about 0.9, according to some embodiments. If the undercut (or the ratio of u/d) is too small, the mechanical integrity of the via may be compromised by the metal that fills the via pulling out in response to vertical forces. If the u/d ratio is too large (e.g., d is too small), the via anchor may crack under vertical stress.

Repeating the above passivation and etching sequence-sequence of operations 214 and 216—the multi-cycle chemical process can be performed using a multi-chamber spray tool. In some embodiments, the multi-cycle passivation and etching sequence can be performed at successive intervals to a stationary semiconductor wafer. Instead of moving the wafer from a passivation process module to an etching process module, the semiconductor wafer can remain stationary in the same processing module, while a spray nozzle applies the oxidizing chemical, followed by applying hot DI water. Using water as the etchant facilitates such a sequence because the hot DI also acts as a rinse agent, without introducing additional contaminants or chemicals that may be incompatible with the oxidizing agent.

Consequently, the passivation chemistry and hot DI can alternately be sprayed from the same apparatus for a prescribed number of chemical reaction cycles. The number of chemical reaction cycles can be automatically increased if needed, in accordance with defect data measured at a later processing operation, creating a feedback control system in which operations 214 and 216 are repeated, as shown in FIG. 2. For example, once the vias are filled with metal and additional interconnect layers are formed, strain on the contact layer may cause malformed via anchors to fail, resulting in metal loss defects that are detectable through either in-line or at end-of-line electrical testing. Such malformed vias may have a ratio of u/d that is too small, for example, if the undercut is insufficient. Based on the failure data, instructions can be sent to the spray module, at operation 218, to increase the number of passivation/etch cycles at the contact via anchor formation operation. Instead of increasing the number of cycles, increasing the processing time and/or various chemical concentrations may be performed to improve effectiveness of the passivation and etching sequence.

Figure 6:
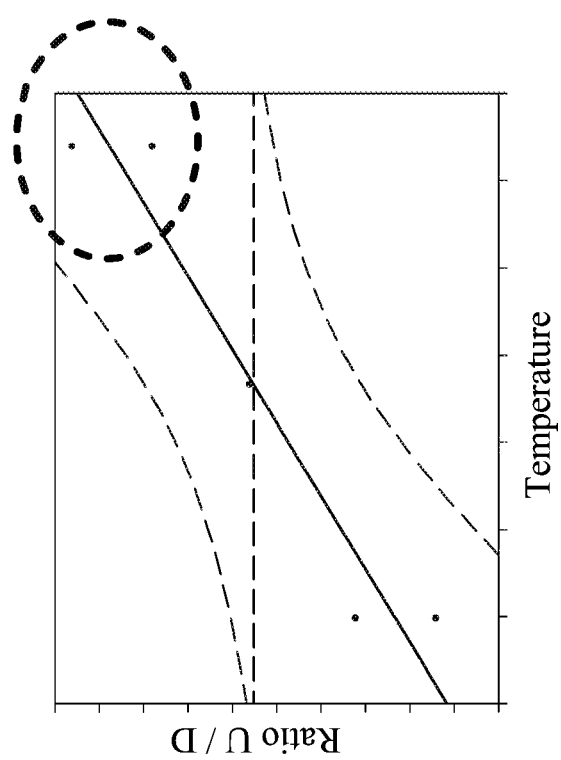
FIG. 6 is a plot that shows the effect of passivation temperature on via anchor profiles, in accordance with some embodiments of the present disclosure.
Figure 7A:
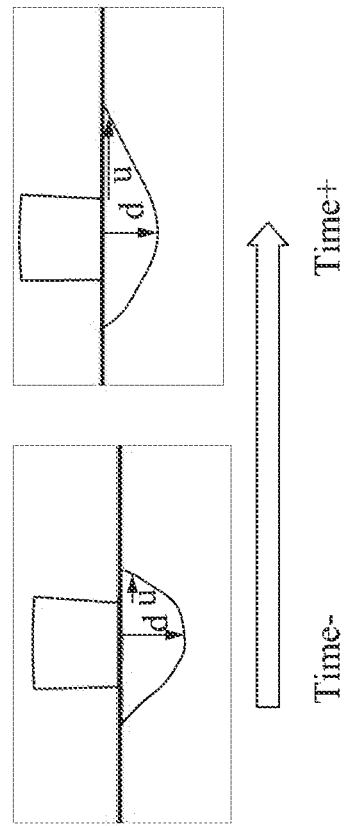
FIGS. 7A and 7B are cross-sectional views of via anchors for different passivation conditions, in accordance with some embodiments of the present disclosure.

FIGS. 6 and 7A show the effect of different process variables on a desired shape profile of a via anchor opening, according to some embodiments. FIG. 6 is a plot of a lateral/recess ratio of dimensions u/d as a function of temperature of a passivation chemical. FIG. 6 shows that the ammonium hydroxide temperature during passivation operation 214 is linearly correlated to this ratio (p=0.0374), which represents the desired via anchor etch profile. To achieve a u/d ratio of about 0.75 or greater, indicated in the dashed circle, the temperature of the chemical can be increased to about 65 degrees C. to catalyze the oxidation reaction.

Figure 7B:
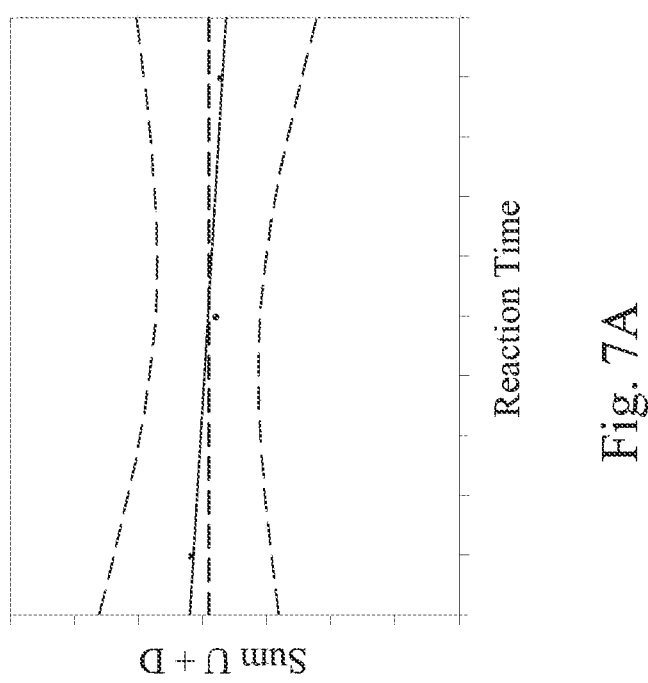

FIG. 7A is a plot of a sum of recess and lateral dimensions as a function of reaction time of the passivation process using the chemical mixture SC1. FIG. 7A shows that the SC1 reaction time is correlated to the amount of recess and lateral etching, with a p value of 0.1917. Here, it is shown that the longer the chemical reaction time for the passivation operation, the less etching occurs in the etching operation. However, for the times given, between about 10 seconds and about 30 seconds, the amount of recess plus lateral etching decreases from about 23 nm to about 22 nm. This relationship indicates that the effect of the passivation operation occurs primarily in the first 10 seconds, and that increasing the reaction time beyond 10 seconds will not be particularly effective. FIG. 7B shows the effect of increasing passivation time on the shape of via anchors. As passivation time increases, the recess depth d decreases by about 2 nm, while the undercut u increases from about 2 nm to about 10 nm.

Figure 8:
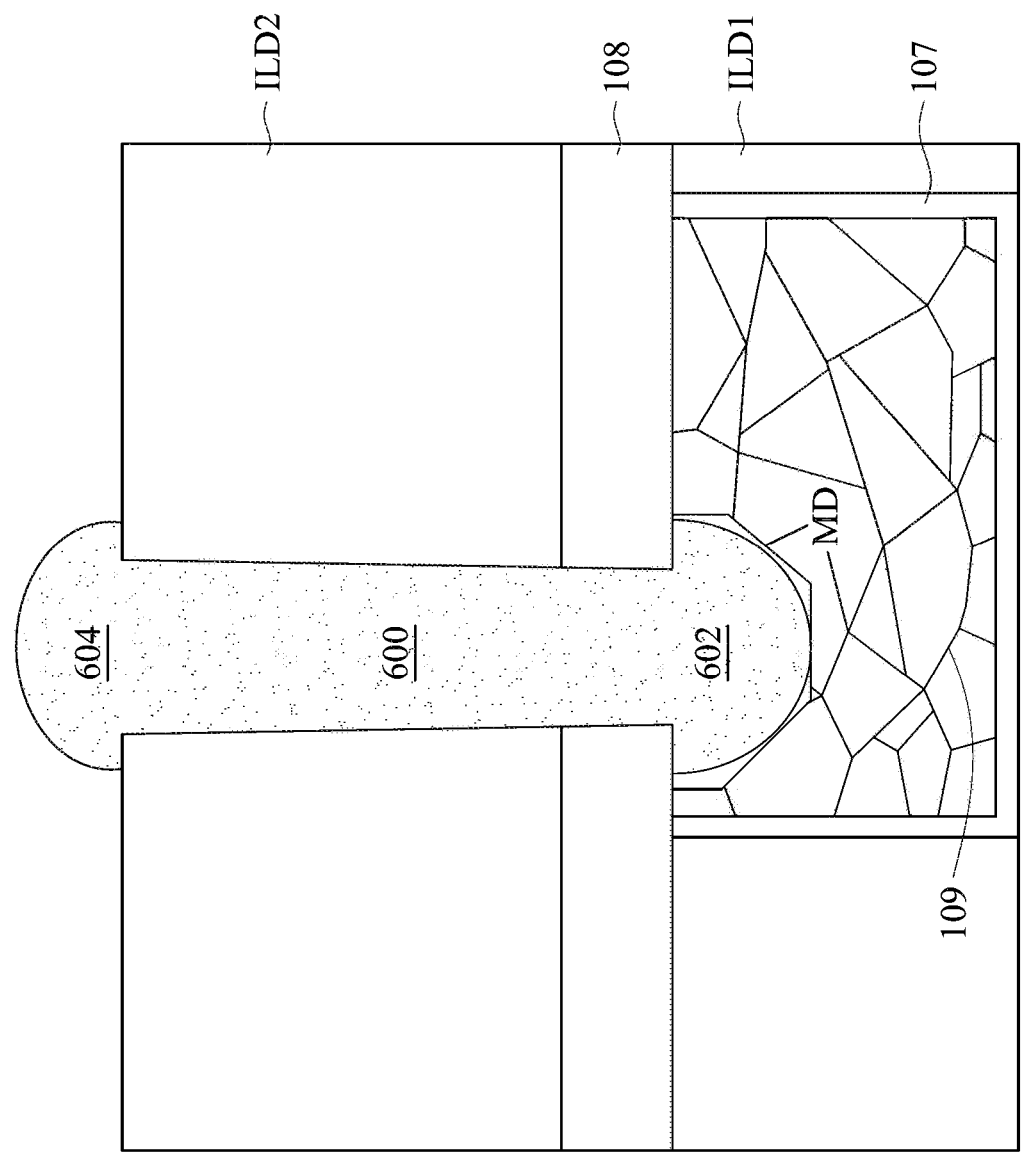

Referring to FIG. 2 in operation 220, via openings 400 and via anchor openings 500 can be filled with metal as shown in FIG. 8, in accordance with some embodiments, to create a via 600 and a via anchor 602. Via 600 and via anchor 602 can be filled using a chemical vapor deposition (CVD) process, a physical vapor deposition (PVD) process, or any other deposition process suitable for filling high aspect ratio structures. Via 600 and via anchor 602 can be made of tungsten (W), for example, and can include a liner material. Via 600 may be over-filled, creating excess metal 604 protruding above a top surface of ILD2.

Figure 9:
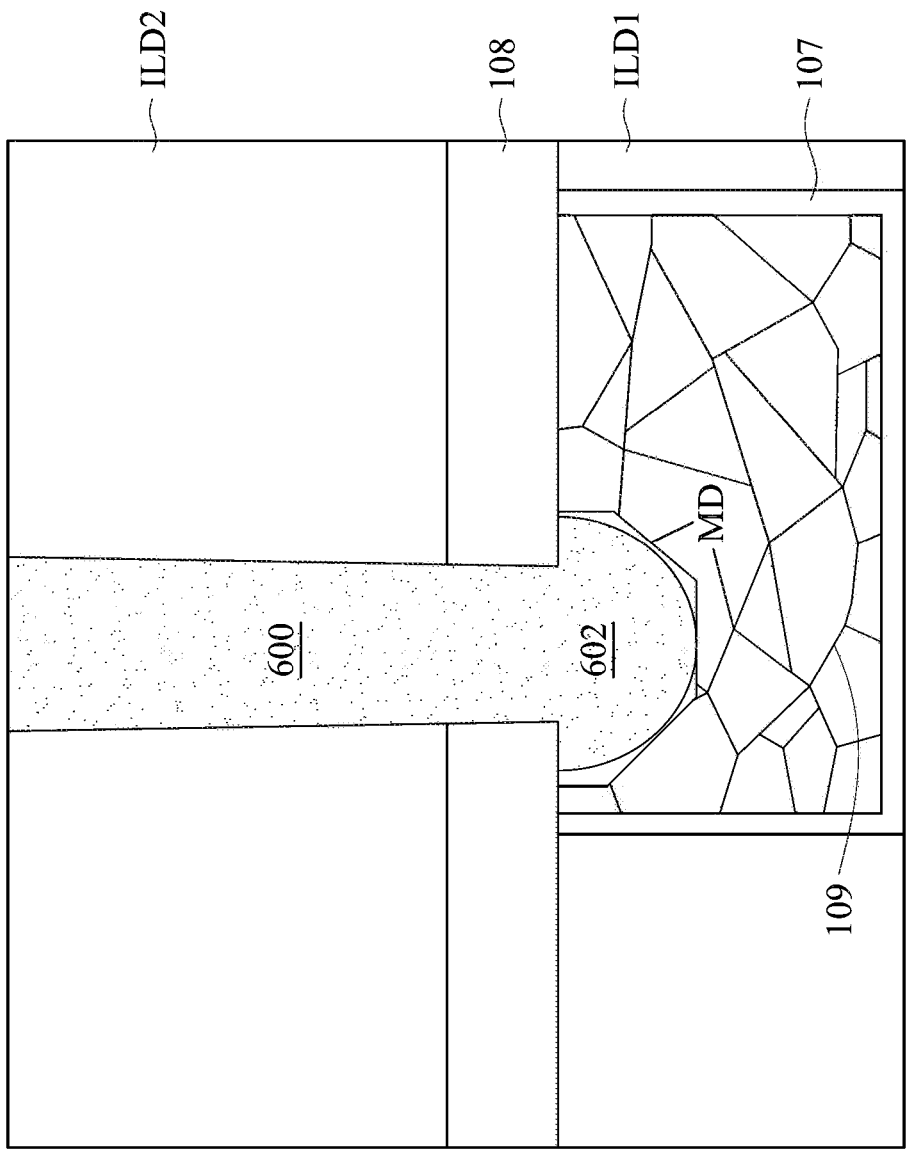

Referring to FIG. 2 in operation 222, filled via 600 can be polished using a CMP process to substantially coplanarize a top surfaces of via 600 and ILD2 as shown in FIGS. 8 and 9, in accordance with some embodiments. During the CMP process, excess metal 604 is removed, as shown in FIG. 9. In some embodiments, the CMP process can use a silicon or an aluminum abrasive slurry with abrasive concentrations ranging from about 0.1% to about 3%. In some embodiments, the abrasive slurry may have a pH level less than about 7 for W metal.

Referring to FIG. 2 in operation 224, metal line M1 is formed, as shown in FIG. 1, in accordance with some embodiments. Metal line M1 can be formed using either a patterning process or a damascene process, depending on the desired metal material. If metal line M1 is to be made of an aluminum alloy, a patterning process can be used in which a layer of metal is deposited and patterned using either a photoresist mask or a hard mask, or both, followed by a metal etch operation. Then ILD2 is deposited between the metal lines. If, however, metal line M1 is to be made of copper, ILD2 can be deposited first, and then a trench can be etched into ILD2 and filled with copper using a plating process, e.g., electroplating or electro-less plating. Alternatively, the trench for metal line M1 can be etched at the same time as the via opening for via V1. After formation of via anchor opening 500, and the two can be plated together.

Operations 208-224 can then be repeated to form additional vias and metal lines above M1. Each time via openings are formed, operations 214-218 can optionally be performed to shape via anchor openings 500. However, operations 214-218 may not be needed for formation of via anchors in metal lines as opposed to forming via anchors 602 in contact metal. In some embodiments, damascene interconnect structures may be advantageous for use at layers having smaller pitch, e.g., at an interconnect minimum pitch layer or at a secondary minimum pitch layer, such as at metallization layers 1-5. In some embodiments, via openings 400 and trenches for upper metal lines above M1 can be formed together as a dual damascene trench. Etching the dual damascene trench can use a process similar to the process for forming contact openings in ILD1, as described above. The dual damascene trench can then be lined and filled with copper. In some embodiments, a single damascene process can be used to form a lower metal line $M_x$, an upper metal line $M_{x+1}$, and vias $V_x$. In some embodiments, both metal lines $M_x$ and $M_{x+1}$ and via $V_x$ can be formed by lithographic patterning.

Figure 10:
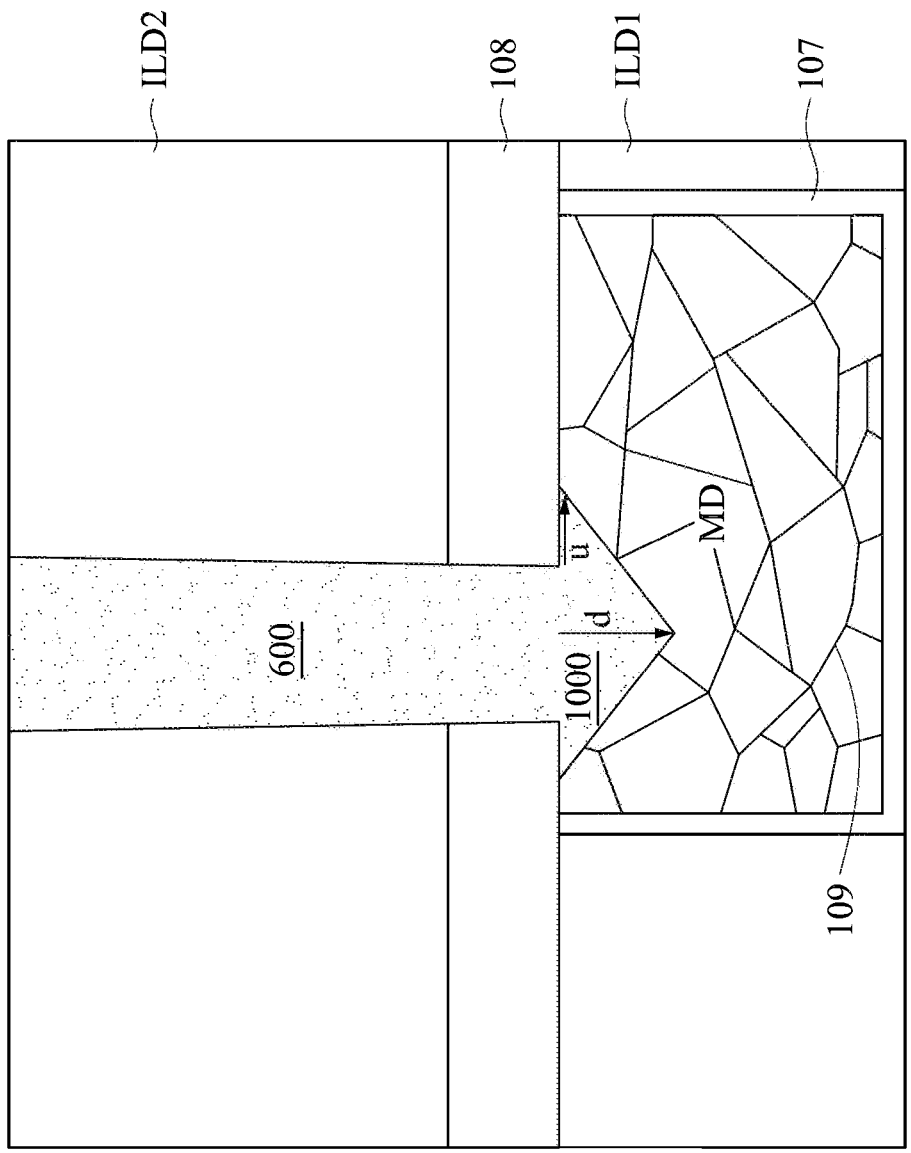

FIG. 10 shows an angled via anchor 1000 made by a similar multi-cycle etching process as shown in FIG. 2 and described above. Angled via anchor 1000 is an alternative shape to curved via anchor 602, which can result, for example, if the vertical etch rate of the cobalt exceeds the horizontal etch rate. Characteristics of via anchor 1000 can be similar to those of curved via anchor 602, except for the angled shape of the lower boundary of the anchor. Angled via anchor 1000, like curved via anchor 602, may correspond to a slot via, a square via, or a round via, and the ratio of lateral undercut to recess depth, u/d, can be similar, e.g., >0.75. Intermediate shapes between angled via anchor 1000 and curved via anchor 602 may also be used.

As described above, improved control of via anchor profiles in metals that exhibit grain boundaries can be achieved by slowing down the anchor etching process and by introducing a passivation operation. By first passivating the metallic surface, etchants can be prevented from dispersing along grain boundaries, thereby distorting the shape of the via anchor. An iterative scheme that involves a multi-cycle process of alternating passivation and etching operations can control the formation of optimal via anchor profiles. When a desirable via anchor shape is achieved having sufficient lateral undercut, the via anchor maintains structural integrity of the via thereby improving reliability of the interconnect structure.

In some embodiments, a method includes: forming a source/drain region and a gate region on a substrate; depositing a first inter-layer dielectric (ILD) over the source/drain region and the gate region; forming, in the first ILD, a source/drain contact coupled to the source/drain region; depositing a second ILD over the source/drain contact; forming, in the second ILD, a via opening that protrudes into the source/drain contact; forming, at a bottom surface of the via opening, a via anchor opening using multiple chemical reaction cycles, each chemical reaction cycle comprising a passivation operation and an etching operation; filling the via opening and the via anchor opening with a metal; and polishing a top surface of the metal to be co-planar with the second ILD.

In some embodiments, a structure includes: a metal comprising grain boundaries; a dielectric material formed on the metal; and a via structure extending through the dielectric material and into the metal, the via structure having a via anchor formed at a top surface of the metal, where the via anchor has a depth extending vertically into the metal and an undercut extending laterally along the top surface of the metal, and wherein the depth and the undercut define a curved via anchor profile that is not aligned with the grain boundaries.

In some embodiments, a method includes: forming, on a semiconductor substrate, a transistor having a source/drain region; forming an interconnect over the transistor, the interconnect having a source/drain contact electrically coupled to the source/drain region; forming a via coupled to the source/drain contact; and forming a via anchor at a bottom of the via, the via anchor having a vertical depth and a lateral undercut, wherein a ratio of the lateral undercut to the vertical depth is greater than about 0.75.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a source/drain region and a gate region on a substrate;
    depositing a first inter-layer dielectric (ILD) over the source/drain region and the gate region;
    forming, in the first ILD, a source/drain contact coupled to the source/drain region;
    depositing a second ILD over the source/drain contact;
    forming, in the second ILD, a via opening that protrudes into the source/drain contact;
    forming, at a bottom surface of the via opening, a via anchor opening using multiple chemical reaction cycles, each chemical reaction cycle comprising a passivation operation and an etching operation;
    filling the via opening and the via anchor opening with a metal; and
    polishing a top surface of the metal to be co-planar with the second ILD.

2. The method of claim 1, wherein forming the source/drain contact comprises forming the source/drain contact that comprises cobalt.

3. The method of claim 1, wherein filling the via opening and the via anchor opening with the metal comprises filling the via opening and the via anchor opening with a metal material comprising tungsten.

4. The method of claim 1, wherein the passivation operation comprises exposing the via anchor opening to an oxidant to initiate an oxidation reaction.

5. The method of claim 4, wherein exposing the via anchor opening comprises exposing the via anchor opening to a mixture of oxygen- and ammonia-containing compounds.

6. The method of claim 5, wherein a pH of the mixture is between about 9 and about 12.

7. The method of claim 4, wherein exposing the via anchor opening comprises exposing the via anchor opening to a mixture of peroxide and ammonia.

8. The method of claim 1, wherein the etching operation comprises exposing the via anchor opening to hot de-ionized water.

9. The method of claim 1, wherein the etching operation is performed at a temperature between about 25° C. and about 70° C.

10. The method of claim 4, wherein forming the via anchor opening comprises forming a vertical recess having a depth and a lateral recess having an undercut.

11. The method of claim 10, wherein forming the vertical recess comprises varying a duration of the oxidation reaction to achieve a desired depth.

12. The method of claim 10, wherein forming the lateral recess comprises varying a temperature while forming the via anchor opening to achieve a desired undercut.

13. A structure, comprising:
a metal comprising grain boundaries;
a dielectric material formed on the metal; and
a via structure extending through the dielectric material and into the metal, the via structure having a via anchor formed at a top surface of the metal, wherein the via anchor has a depth extending vertically into the metal and an undercut extending laterally along the top surface of the metal, and wherein the depth and the undercut define a curved via anchor profile that is not aligned with the grain boundaries.

14. The structure of claim 13, wherein the via anchor comprises tungsten and the metal comprises cobalt.

15. The structure of claim 13, wherein a ratio of the undercut to the depth is between about 0.7 and about 0.9.

16. A method, comprising:
forming, on a semiconductor substrate, a transistor having a source/drain region;
forming an interconnect over the transistor, the interconnect having a source/drain contact electrically coupled to the source/drain region;
forming a via coupled to the source/drain contact; and
forming a via anchor at a bottom of the via, the via anchor having a vertical depth and a lateral undercut, wherein a ratio of the lateral undercut to the vertical depth is greater than about 0.75.

17. The method of claim 16, wherein forming the via anchor comprises performing a multi-cycle process, wherein each cycle of the multi-cycle process comprises a passivation operation and an etching operation.

18. The method of claim 17, wherein the multi-cycle process comprises a wet chemical process that applies two different chemicals at successive intervals in a same processing module.

19. The method of claim 16, wherein forming the via anchor comprises forming the via anchor with a rounded profile in the source/drain contact.

20. The method of claim 16, wherein forming the via anchor comprises forming the via anchor with an angled profile in the source/drain contact.

* * * * *